United States Patent
Severns et al.

(10) Patent No.: US 11,573,257 B2
(45) Date of Patent: Feb. 7, 2023

(54) SYSTEMS AND METHODS FOR ACOUSTICALLY DETECTING DIELECTRIC BREAKDOWN AND PARTIAL DISCHARGE EVENTS IN ELECTRICAL DEVICES

(71) Applicant: THE BOEING COMPANY, Chicago, IL (US)

(72) Inventors: Christopher Mark Severns, Sammamish, WA (US); John R. Hull, Sammamish, WA (US)

(73) Assignee: The Boeing Company, Chicago, IL (US)

( * ) Notice: Subject to any disclaimer, the term of this patent is extended or adjusted under 35 U.S.C. 154(b) by 740 days.

(21) Appl. No.: 16/447,774

(22) Filed: Jun. 20, 2019

(65) Prior Publication Data
US 2020/0400736 A1  Dec. 24, 2020

(51) Int. Cl.
*G01R 31/12* (2020.01)
*G01R 31/14* (2006.01)

(52) U.S. Cl.
CPC ..... *G01R 31/1209* (2013.01); *G01R 31/1227* (2013.01); *G01R 31/14* (2013.01)

(58) Field of Classification Search
CPC ............ G01R 31/1209; G01R 31/1218; G01R 31/1263; G01R 31/129; G01R 31/18; G01R 31/1227; G01R 31/12; G01R 31/14
See application file for complete search history.

(56) References Cited

U.S. PATENT DOCUMENTS

| 6,495,972 B1 | 12/2002 | Okamoto et al. |
| 8,265,287 B2 | 9/2012 | Kageyama |

(Continued)

FOREIGN PATENT DOCUMENTS

| EP | 2857852 A1 * | 4/2015 | ............ G01N 29/00 |
| EP | 2857852 A1 | 4/2015 | |

(Continued)

OTHER PUBLICATIONS

European Extended Search Report regarding European Patent Application No. 20167985.9 dated Oct. 6, 2020; pp. 1-10.

(Continued)

*Primary Examiner* — Tarun Sinha
*Assistant Examiner* — James I Burris
(74) *Attorney, Agent, or Firm* — Armstrong Teasdale LLP (57) ABSTRACT

A system for acoustically detecting dielectric breakdown of, or partial discharge within, or on, an electrical device includes at least one electroacoustic (EA) transducer configured to detect an acoustic vibration of the electrical device, and a controller electrically connected to the at least one EA transducer. The controller is configured to receive a signal from the at least one EA transducer, and analyze the signal to determine whether the signal includes data associated with an acoustic vibration in a frequency range of dielectric breakdown and/or partial discharge of the electrical device. The applicability of such a system includes, but is not limited to, electronic parts or assembly screening, life characterization testing for materials and processes, diagnostic methods or aides, augmenting testing of components, assemblies or systems, and in service monitoring to support preventative or condition based maintenance to avert an in-service issues.

18 Claims, 5 Drawing Sheets

(56) References Cited

U.S. PATENT DOCUMENTS

| | | |
|---|---|---|
| 9,160,299 B2 | 10/2015 | Goto et al. |
| 9,901,281 B2 | 2/2018 | Ikushima et al. |
| 9,961,440 B2 | 5/2018 | Gabai et al. |
| 9,976,989 B2 | 5/2018 | Dehghan Niri et al. |
| 9,978,894 B2 | 5/2018 | Jorgenson |
| 10,209,292 B2 | 2/2019 | Umemoto et al. |
| 2009/0202083 A1 | 8/2009 | Kageyama |
| 2012/0265458 A1 | 10/2012 | Agapiou et al. |
| 2013/0041355 A1 | 2/2013 | Heeren et al. |
| 2015/0117692 A1 | 4/2015 | Akino |
| 2016/0337751 A1 | 11/2016 | Gabai et al. |
| 2017/0168024 A1* | 6/2017 | Dehghan Niri .... G01R 31/1227 |
| 2020/0363274 A1* | 11/2020 | Scott ................ B60G 17/01941 |

FOREIGN PATENT DOCUMENTS

| | | | |
|---|---|---|---|
| JP | 2009229347 A | * | 10/2009 |
| WO | 2016084133 A1 | | 6/2016 |

OTHER PUBLICATIONS

S. A. Boggs, Partial Discharge Part III: cavity-Induced PD in Solid Dielectrics. IEEE Electrical Insulation Magazine, vol. 6, No. 6, p. 11 (1990).

\* cited by examiner

SYSTEMS AND METHODS FOR ACOUSTICALLY DETECTING DIELECTRIC BREAKDOWN AND PARTIAL DISCHARGE EVENTS IN ELECTRICAL DEVICES

FIELD

The field of the disclosure relates generally to systems and methods for detecting dielectric breakdown and/or partial discharge within an electrical device, and more particularly, to systems and methods for acoustically detecting dielectric breakdown of an electrical device.

BACKGROUND

At least some known methods for testing an electrical component, such as a dielectric substrate of a printed circuit board or printed wiring board, include subjecting the component to a high direct current (DC) or alternating current (AC) electric field and waiting a predetermined time (e.g., 60 seconds) for dielectric breakdown to occur. During this type of test (generally referred to as a "withstand test"), if no electrical current is detected within the component above a leakage current, the component may be deemed acceptable for use, in that the component may be deemed to exclude physical imperfections or defects that may tend to cause dielectric breakdown during normal operation. One disadvantage of this method is that dielectric breakdown, or even a "partial discharge" that doesn't fully result in a breakdown of the dielectric insulation, may not occur until and unless a cosmic ray (or other ionizing or free-electron producing event) is incident upon an imperfection (e.g., a void or cavity) within the dielectric of the component. As a result, even under test, imperfections may not be detected.

Another technique for testing an electrical component may include the application of a large alternating current (AC) electric field to the component. During this type of test, the component may be observed, over a period of time, for current spikes indicative of dielectric breakdown and/or partial discharge within the component. One disadvantage of this method is that the component under test may be subject by the test procedure itself to electrical stress in excess of a typical operational range, thereby shortening the operational life of the component. Another disadvantage is that the test procedure may be time consuming, in that the component must be observed for some period of time.

This Background section is intended to introduce the reader to various aspects of art that may be related to the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

In one aspect a system for acoustically detecting dielectric breakdown or partial discharge of an electrical device is provided. The system includes at least one electroacoustic (EA) transducer configured to detect an acoustic vibration of the electrical device, and a controller electrically connected to the at least one EA transducer. The controller is configured to execute instructions stored in a memory, which when executed, cause the controller to at least: receive a signal from the at least one EA transducer; analyze the signal received from the at least one EA transducer; determine, based upon the analyzing, whether the signal received from the at least one EA transducer includes data associated with an acoustic vibration in the frequency range of partial discharge of the electrical device; and in response to determining that the signal received from the at least one EA transducer includes the data associated with the acoustic vibration in the frequency range of partial discharge, generate an alert.

In another aspect, an electrical system is provided. The electrical system includes an electrical device, at least one electroacoustic (EA) transducer configured to detect an acoustic vibration of the electrical device, and a controller electrically connected to the at least one EA transducer. The controller is configured to execute instructions stored in a memory, which when executed, cause the controller to at least: receive a signal from the at least one EA transducer; analyze the signal received from the at least one EA transducer; determine, based upon the analyzing, whether the signal received from the at least one EA transducer includes data associated with an acoustic vibration in the frequency range of partial discharge of the electrical device; and in response to determining that the signal received from the at least one EA transducer includes the data associated with the acoustic vibration in the frequency range of partial discharge, generate an alert.

In yet another aspect, a method for acoustically detecting dielectric breakdown or partial discharge of an electrical device is provided. The method includes: receiving, by a controller electrically connected to at least one electroacoustic (EA) transducer, a signal from the at least one EA transducer, the EA transducer mechanically coupled to the electrical device and configured to detect an acoustic vibration of the electrical device; analyzing, by the controller, the signal received from the at least one EA transducer; determining, by the controller and based upon the analyzing, whether the signal received from the at least one EA transducer includes data associated with an acoustic vibration in the frequency range of partial discharge of the electrical device; and in response to determining that the signal received from the at least one EA transducer includes the data associated with the acoustic vibration in the frequency range of partial discharge, generating an alert.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

Although specific features of various embodiments may be shown in some drawings and not in others, this is for convenience only. Any feature of any drawing may be referenced and/or claimed in combination with any feature of any other drawing.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

Systems and methods for acoustically detecting dielectric breakdown and/or partial discharge of an electrical device are described. In an example embodiment, partial electrical discharge within, or on the surface of, an electrical device may occur as a result of an imperfection or defect, such as a void or cavity, within a dielectric of the electrical device, where the imperfection may be regarded as a dielectric breakdown and/or partial discharge of the electrical device, in that the imperfection may develop over time as the device is operational in the field.

To detect dielectric breakdown and/or partial discharge, an electroacoustic transducer, such as a contact microphone, may be mechanically coupled to the electrical device, such as, for example, to the dielectric of the device. The electroacoustic device may be tuned or configured to detect acoustic vibrations in a frequency range associated with partial discharge, where, for example, partial discharge may induce a mechanical pressure wave within the dielectric, which the EA transducer may detect. A controller or processor may receive and analyze a data signal provided by the EA transducer, and if an acoustic vibration, such as a frequency spike, in the range of frequencies associated with partial discharge occurs, the controller may generate an alert to indicate possible dielectric breakdown and/or partial discharge of the device.

Technical effects of the systems and methods described herein include, at least: (a) acoustic detection, using an electroacoustic transducer coupled to a dielectric of an electrical device, of an acoustic vibration representative of partial discharge and/or dielectric breakdown and/or partial discharge; (b) detection, using a quadrilateral detection circuit, of one or more circuit characteristics representative of partial discharge and/or dielectric breakdown; (c) verification, using the circuit characteristics derived from the quadrilateral detection circuit, of partial discharge and/or dielectric breakdown; (d) verification of partial discharge and/or dielectric breakdown based upon comparison of peak-to-peak distances or gaps between frequency spikes of peaks of a signal received from the electroacoustic transducer; and (e) generation of an alert, warning, or other indication that partial discharge and/or dielectric breakdown have occurred.

As used herein, the phrase "dielectric breakdown" may therefore refer to an event that results in the full loss of a dielectric or electrical insulator to insulate two or more electrical conductors of different potential. As used herein, the phrase "disruptive discharge" is an electrical event where electrical charge and its resultant current (rate of charge movement) is sufficient to enable high fault current to flow between electrical conductors of different voltage potentials. In solid insulation systems, disruptive discharges may breakdown the material rendering it at least partially incapable of providing any isolation between electrical conductors. In liquid or gas based insulation systems, the damage is reversible but the affected electrical equipment or associated electrical system are disrupted or otherwise de-energized through protective action. Dielectric breakdown can also occur on the surface of the device or assembly, where insulation has been compromised or otherwise defective.

As used herein, the phrase "partial discharge" may therefore refer to an electric discharge that only partially bridges the insulation system between conductors when the voltage stress exceeds a critical value. These partial discharges may or may not occur adjacent to a conductor. Internal to a dielectric structure, such as in the case in a printed wiring board, or printed circuit board, defects such as delaminations or voids in epoxy may contain trapped gas. Under sufficient electric field stress and temperature conditions, electrical charge can accumulate in the vicinity or in the void. In the presence of a sufficient local electrical field, the gas can undergo ionizations enabling the discharge of local charge accumulation through the gas within the void. The resultant heating due to free electron and ion movement results in a rapid heating of the gas which then generates a high pressure pulse. This high pressure pulse is then transmitted as acoustic or mechanical energy through the surrounding dielectric structure. The acoustic sensors and transducers described herein are designed to detect and for the correct frequencies, and signal processing can be used to detect "partial discharges", "disruptive discharges", or "dielectric breakdown." Surface partial discharges are also possible which may also produce acoustic energy that is transmitted into the dielectric structure, into conductors, interfaces as well as in the surrounding gas or liquid dielectric.

When a partial discharge occurs within an electrical device, the discharge may induce an acoustic vibration in the electrical device (or dielectric thereof), which may be detected and analyzes, as described herein. The vibration may generally resonate in a frequency range of approximately 500 kHz to 250 MHz (although other frequency ranges may occur as well).

Figure 1:
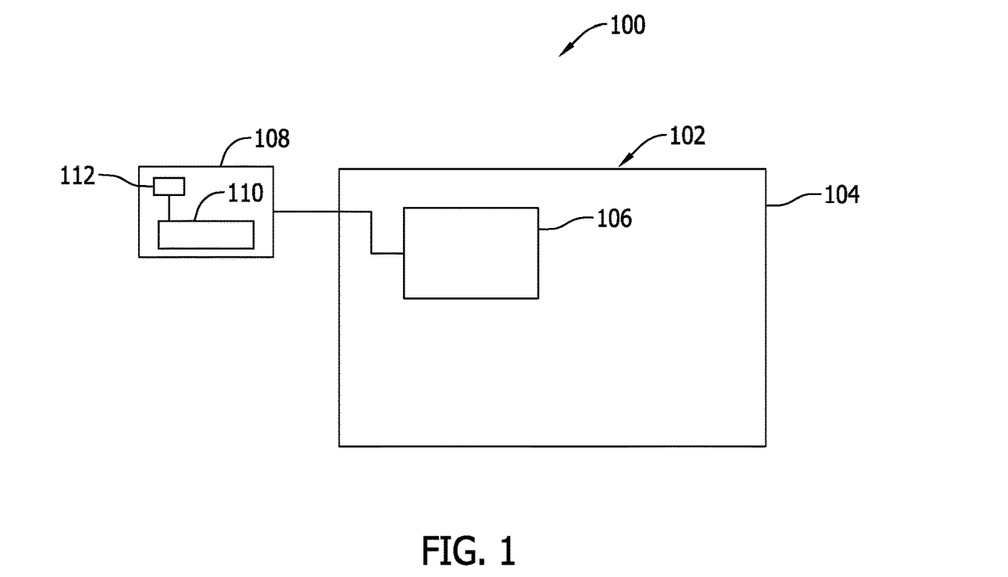
FIG. 1 is a block diagram of an example system for acoustically detecting dielectric breakdown and/or partial discharge of an electrical device.

FIG. 1 is a block diagram of an example system 100 for acoustically detecting dielectric breakdown of an electrical device 102. System 100 includes an electrical device 102 and a controller 108. Electrical device 102 includes a dielectric 104 and an electroacoustic (EA) transducer 106. Controller 108 includes a memory 110 and a processor 112.

In the example embodiment, dielectric 104 may include any suitable dielectric or dielectric substrate, such as any dielectric composite or multi-layer laminate used in the manufacture of a printed circuit board (PCB), a printed wiring board (PWB), rotating machinery windings or coils, and/or any other electric device or electric circuit.

Electrical device 102 may also include a plurality of components mounted on dielectric 104 and electrically connected by way of one or more electrical traces, wires, solder joints, and the like. The components included on electrical device are not generally central to an understanding of the present disclosure, but may include, for example, one or more resistors, one or more capacitors, one or more inductors, one or more switching devices (e.g., transistors, MOSFETs, IGBTs, BJTs, etc.), and/or a variety of other hardware components.

In at least some embodiments, electrical device may be operable to control or monitor another system or device, such as a motor, an air compressor, a control panel or display, and/or any other desired device or system. In addition, in at least some embodiments, electrical device 102 is installed in an aerospace system, such as an aircraft, and controls one or more systems or sub-systems of the aircraft or aerospace system.

EA transducer 106 is any of a variety of electroacoustic transducers, such as, for example, a contact microphone, a piezoelectric microphone or ceramic piezoelectric microphone, and/or any other EA transducer capable of mechanically coupling to electrical device 102 and/or dielectric 104 and detecting a structural acoustic vibration within electrical device 102 and/or dielectric 104. In the example embodiment, EA transducer 106 is mechanically coupled to dielectric 104 or another portion of electrical device 102.

In some embodiments, greater than a single EA transducer 106 may be mechanically coupled to dielectric 104. For example, a plurality of EA transducers, each tuned to a specified frequency range, or each arranged to "listen to" a particular portion of dielectric 104, may be implemented. In other embodiments, EA transducer 106 may include one or more air microphones (which are sensitive to vibrations in the air, as opposed to structural vibrations).

In some embodiments, a single or multiple EA transducer (s) 106 may be mechanically coupled to dielectric 104 as a permanent component to a large assembly. For example, a single or a plurality of EA transducers 106, each tuned to a specified frequency range, or each arranged to "listen to" a particular portion of dielectric 104, may be implemented as part of the assembly. In a printed circuit board embodiment, discrete mounted EA transducer 106 and associated control and drive circuitry 108, 110 and 112 may be a part of the completed printed circuit assembly. This enables "self-monitoring" for either failures or derogations during the service life the assembly, which also enables preventative or conditional based maintenance or replacement.

As described in greater detail herein, EA transducer 106 may be configured to detect an acoustic vibration in a specified frequency range and generate an output signal in response. In at least some embodiments, EA transducer 106 may be selected or configured to detect a structural acoustic vibration in a frequency range associated with dielectric or electrical breakdown of dielectric 104. For example, as described above, an acoustic vibration caused by dielectric breakdown or a partial electrical discharge (PD) within dielectric 104 may generally resonate in a frequency range of approximately 500 kHz to 250 MHz (although other frequency ranges may be accommodated). As a result, EA transducer may be configured to detect an acoustic vibration in these high-kHz to low-MHz ranges.

In response to detecting an acoustic vibration, EA transducer 106 may generate an output signal, which may include data (e.g., frequency data) indicating that a PD has occurred. In some cases include an amplifier or pre-amplifier may be connected to EA transducer 106 to amplify the signal output by EA transducer 106. Likewise, in some embodiments, a filter, such as a band pass filter, may be connected to EA transducer 106 to exclude frequencies that are not associated with PD.

Figure 2:
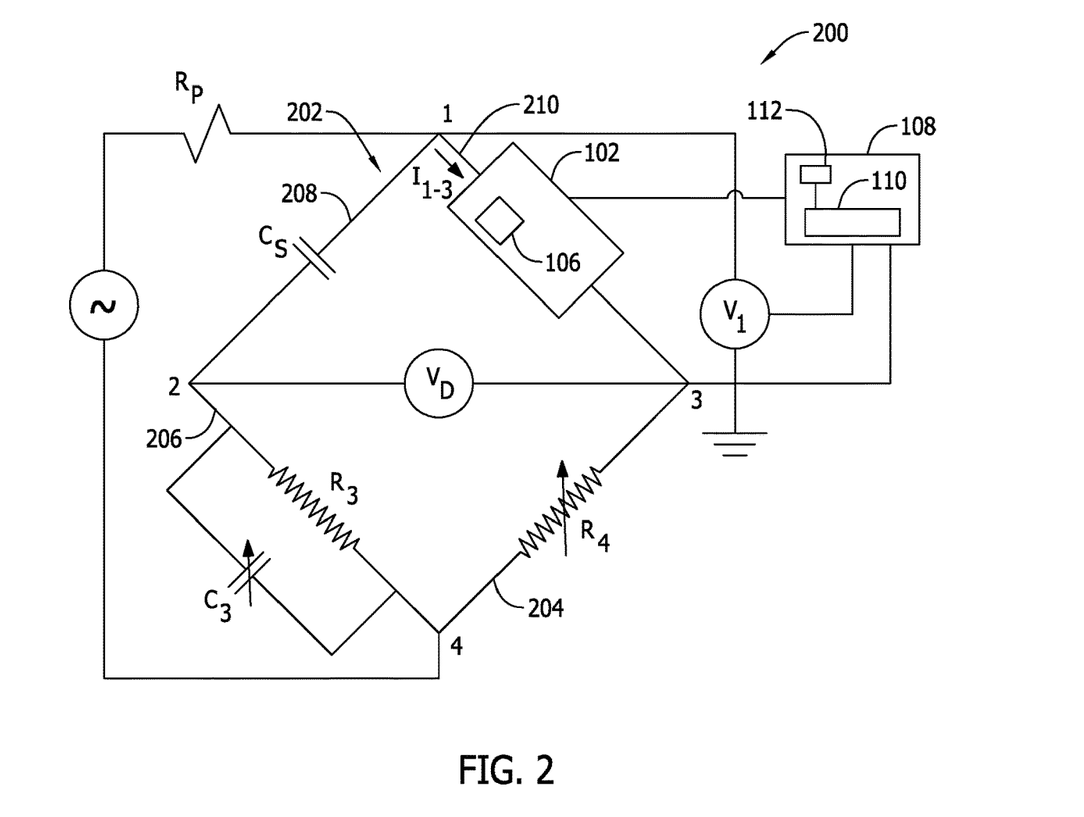
FIG. 2 is a circuit diagram of another example system for acoustically detecting dielectric breakdown and/or partial discharge of an electrical device.

FIG. 2 is a circuit diagram of another example system 200 for acoustically detecting dielectric breakdown and/or partial discharge of electrical device 102. System 200 is similar to system 100, and includes the parts of system 100 described above. System 200 also includes a quadrilateral detection circuit 202. Quadrilateral detection circuit 202 may be a Schering Bridge (or a modified version of a Schering Bridge), a Wheatstone Bridge, and/or another similar circuit.

Quadrilateral detection circuit 202 may thus include a first leg 204, a second leg 206, a third leg 208, and a fourth leg 210. Electrical characteristics of three of the four legs (e.g., legs 204-208) may be known. For example, legs 204-208 may include one or more capacitors, resistors, and/or inductors, whereby a resistance, inductance, and/or capacitance of legs 204-208 may be known. Electrical circuit 102 may be included or connected in fourth leg 210.

It will thus be appreciated that one or more electrical characteristics of electrical circuit 102 may be derived using the known values associated with first through third legs 204-208 and by solving for the electrical characteristics of electrical circuit using one or more known voltage and current equations (e.g., Kirchoff's laws). For example, data collected from quadrilateral detection circuit 202 may include a voltage across electrical circuit 102 ($V_1$), a differential voltage ($V_d$) between third leg 208 and fourth leg 210 (i.e., electrical circuit 102), and a current ($i_{1-3}$) passing through electrical circuit 102.

In operation, system 100 and/or system 200 may be used to test electrical device 102 for PD (or dielectric breakdown). For example, systems 100 or 200 may be used to perform real-time health monitoring of electrical circuit 102. In another embodiment, systems 100 or 200 may be used to test electrical circuit 102 in a laboratory, such as, for example, in the instance that electrical circuit 102 is removed from the field for testing and analysis.

Figure 3:
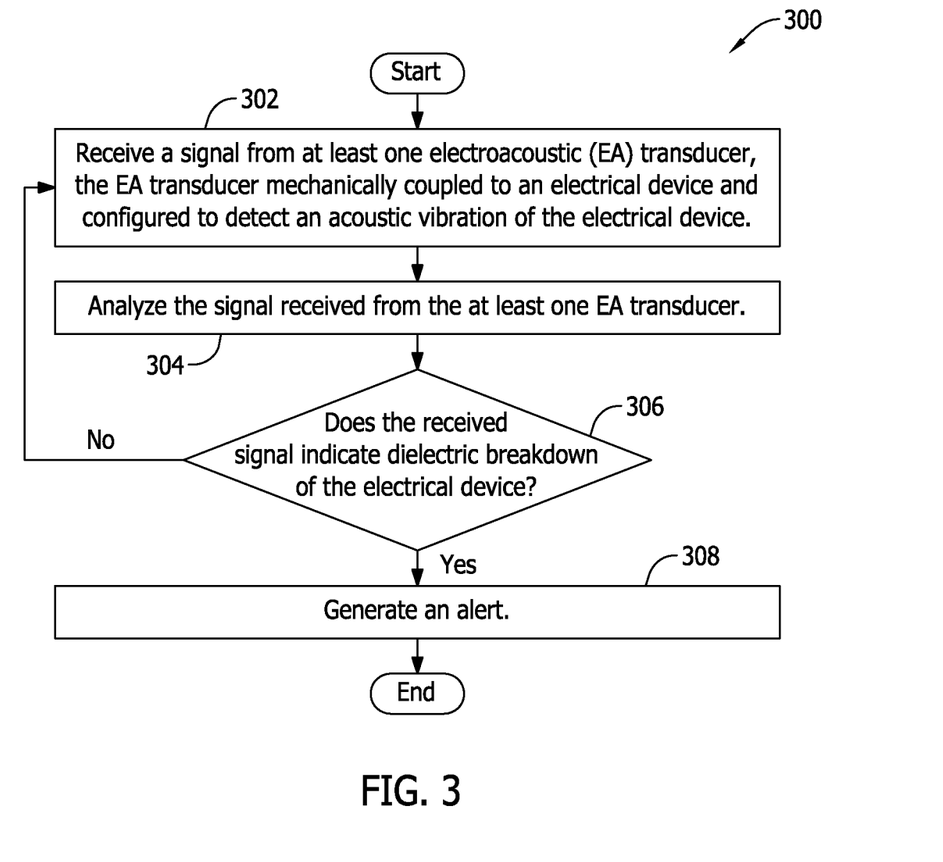
FIG. 3 is a flowchart illustrating an example process for acoustically detecting dielectric breakdown and/or partial discharge of an electrical device.

FIG. 3 is a flowchart illustrating an example process 300 for acoustically detecting PD and/or dielectric breakdown of electrical device 102. In the example embodiment, controller 108 receives a data signal from EA transducer 106 (step 302). The data signal may include frequency data representative of acoustic vibrations, if any, detected by EA transducer 106. For example, in the event that PD occurs, the data signal may include an amplitude spike in the frequency range of dielectric breakdown (see additional description below).

In response to receiving the data signal, controller 108 may analyze the data signal (step 304). For example, controller 108 may analyze the data signal to determine whether a frequency spike exits or has occurred in the frequency range of dielectric breakdown and/or partial discharge (step 306). If such a frequency spike exists, controller 108 may determine that dielectric breakdown and/or partial discharge has occurred (or may have occurred), and generate an alert so indicating (step 308). The alert may be provided to a user, such as, for example, on a computer display or as an audible or another type of alert. On the other hand, if the data signal does not include a frequency spike representative of PD or dielectric breakdown, controller 108 may continue to monitor electrical device 102 in real-time or substantially real-time, receiving continuing reports from EA transducer in the time domain (returning to step 302).

Further, in some embodiments, one or more circuit characteristics of electrical circuit 102 may be measured and/or calculated by controller 108 using quadrilateral detection circuit 202. Specifically, as described above, any of a voltage across electrical circuit 102 ($V_1$), a differential voltage ($V_d$)

between third leg 208 and fourth leg 210 (i.e., electrical circuit 102), and a current ($i_{1-3}$) passing through electrical circuit 102 may be determined. These data may be used to independent determine whether PD or dielectric breakdown have occurred, or they may be used in conjunction with the data signal received from EA transducer 106 to validate the data received from EA transducer. For instance, if the data signal received from EA transducer 106 includes a frequency spike, as described above, data from quadrilateral detection circuit may be used to validate that the data spike was caused by PD within electrical device 102.

Figure 4:
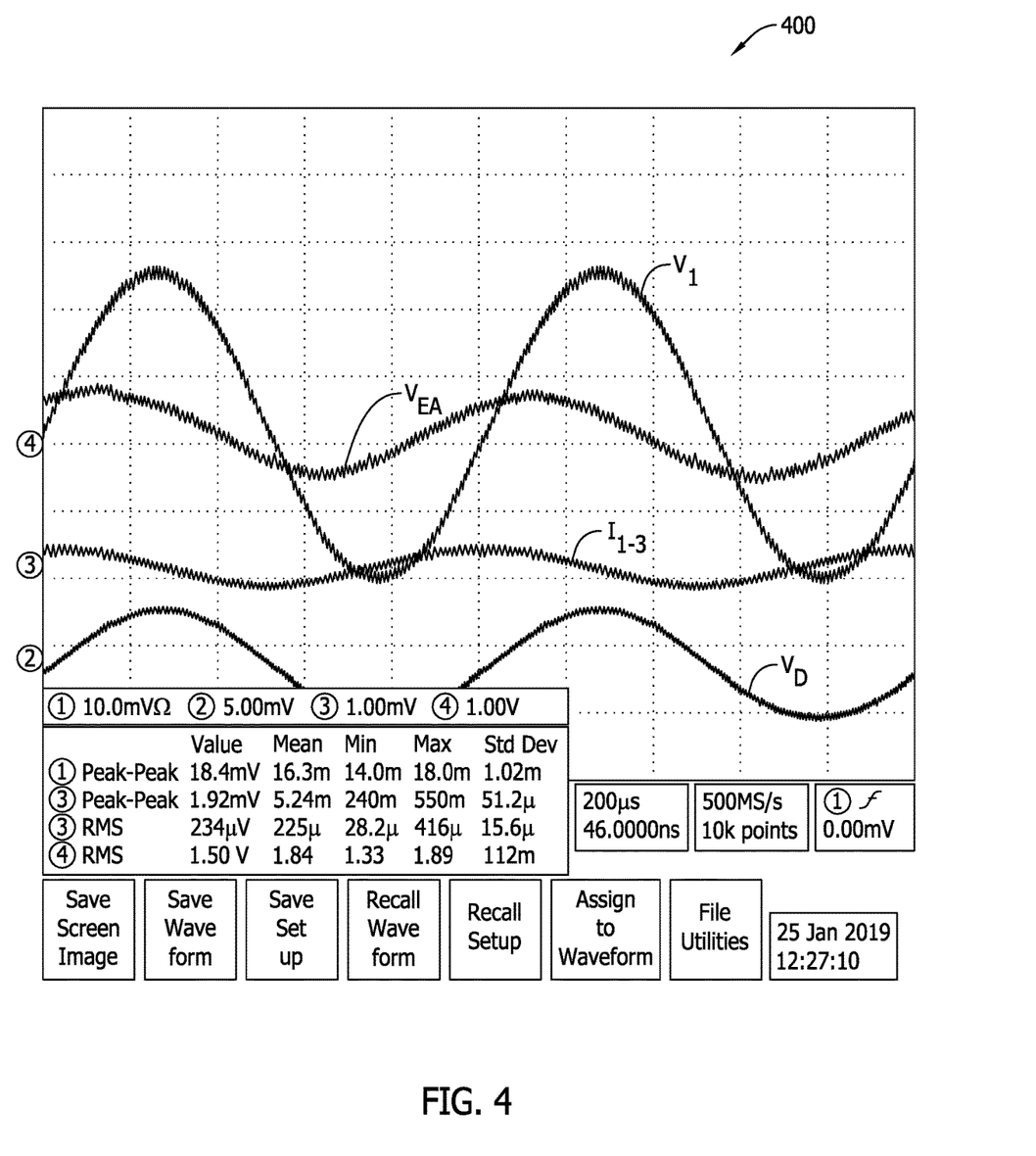
FIG. 4 is a graph of several output waveforms of the system shown in FIG. 2, in which no dielectric breakdown and/or partial discharge of the electrical device occurs.
Figure 5:
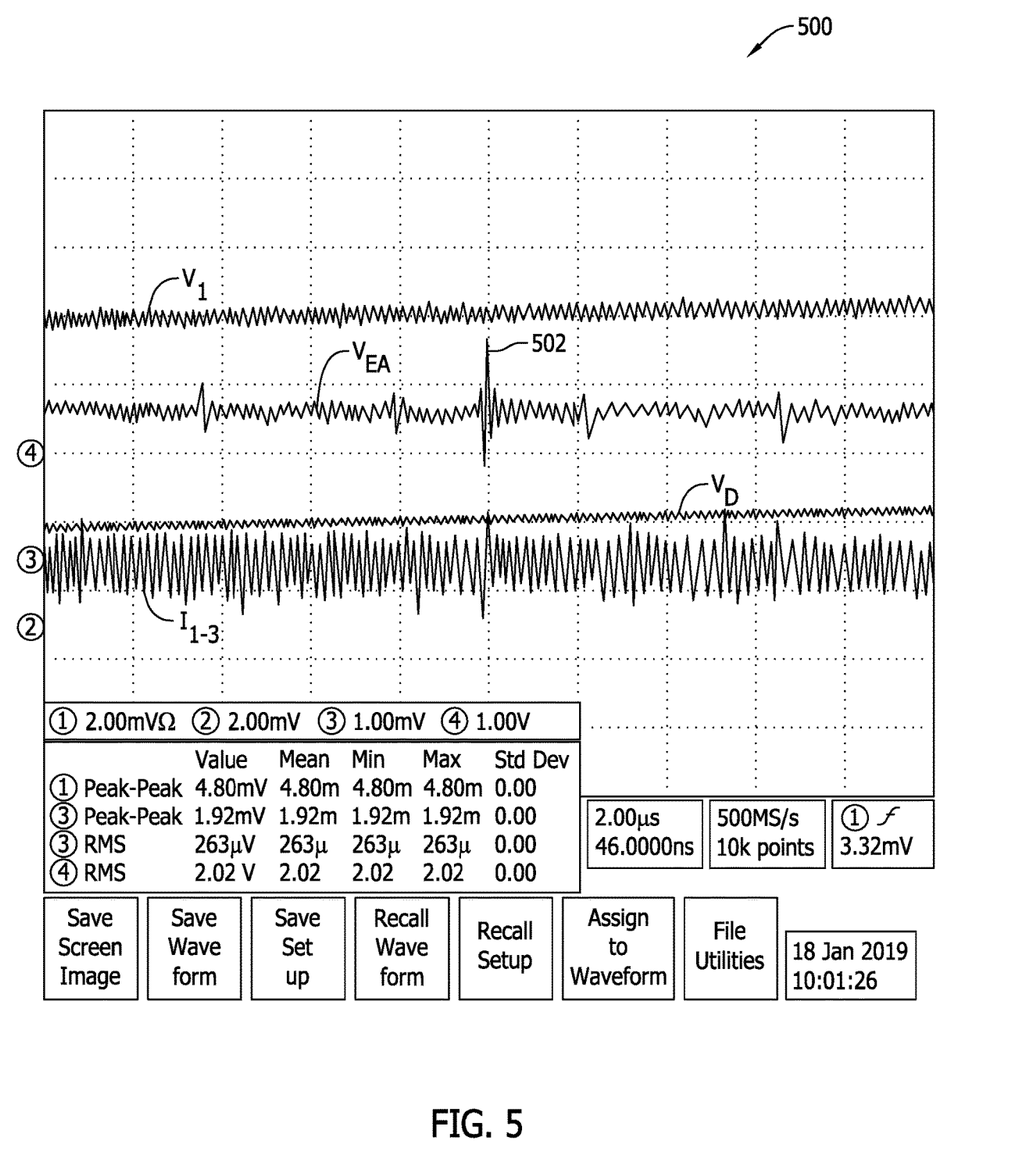
FIG. 5 is a is a graph of several output waveforms of the system shown in FIG. 2, in which dielectric breakdown and/or partial discharge of the electrical device occurs.

FIG. 4 is a graph 400 of several output waveforms of the system 200 (shown in FIG. 2), in which no PD within electrical device 102 occurs. FIG. 5 is a graph 500 of the output waveforms of system 200, in which PD of occurs. More particularly, graphs 400 and 500 show the voltage across electrical circuit 102 ($V_1$), the differential voltage ($V_d$) between third leg 208 and fourth leg 210 (i.e., electrical circuit 102), the current ($i_{1-3}$) passing through electrical circuit 102, and the data signal ($V_{EA}$) received from EA transducer 106. In FIG. 4 and FIG. 5, $V_1$ has been reduced from an actual value by a factor of 1000; this is because a high voltage probe having a voltage divider was used to measure $V_1$ in these figures.

To evaluate the data shown in graphs 400 and 500, controller 108 may, as described, above, and in one embodiment, determine whether data signal, $V_{EA}$, includes frequency spike in the frequency range of dielectric breakdown and/or partial discharge. Such a frequency spike 502 is shown with reference to FIG. 5. The data signal received from EA transducer 106 does not include a frequency spike (such as frequency spike 502) in graph 400 of FIG. 4 (indicating that PD has not occurred). In at least some embodiments, a frequency spike in the range of dielectric breakdown and/or partial discharge indicated on data signal $V_{EA}$ may be sufficient to conclude that electrical circuit 102 has experienced some sort of dielectric breakdown and/or partial discharge.

In another embodiment, controller 108 may verify whether PD or dielectric breakdown have occurred based upon the data received or collected from quadrilateral detection circuit 202. For example, controller 108 may determine the voltage, $V_1$, across electrical circuit 102 at which frequency spike 502 occurs from graph 500. In this example, $V_1$ at frequency spike 502 is approximately 1840 Vrms. Controller 108 may, in addition, retrieve a thickness of dielectric 104 from memory 110, and based upon an assumed shaped of a void or cavity within dielectric 104, calculate an electric field, E, in the void or cavity giving rise to the PD. Specifically, controller 108 may calculate the electric field from the equation:

$$E = \left(\frac{3e}{2e+1}\right) Eo.$$

In this equation, E is the electric field in the void, e is a relative permittivity of the dielectric, and Eo is the electric field in the dielectric.

In the equation above, assuming a dielectric thickness of 250 μm, $E_{void}$ may be calculated to equal approximately $1.39 \times 10^7$ V/m.

Using the calculated electric field in the void, $E_{void}$, as shown above, controller 108 may further determine an estimated void radius using the following equation:

$$E_{void} = \left(1 + \left(\left(\frac{8.6}{2aP}\right)^{1/2}\right)\right) 24P$$

In the equation above, a is the estimated void radius, and P is the air pressure within the void in Pascal. Accordingly, controller may substitute the calculated electric field in the void, $E_{void}$, and an estimated or measured air pressure within the void, P, to solve for a, the estimated void radius.

In this example, the void radius, a, calculated from the data received from quadrilateral detection circuit 202 is 16 μm.

Once a void radius, a, is calculated from the data collected from quadrilateral detection circuit 202, the void radius, a, may be verified by calculating or estimating a duration or period of frequency spike 502 and dividing the period of frequency spike 502 by a speed of sound stored in memory 110. For example, if memory 110 stores a speed of sound of 343 m/s, and a period of frequency spike 502 is 40 ns, controller 108 may calculate an estimated void radius, b, of 13.6 μm.

Controller 108 may compare the estimated void radius, a, derived from quadrilateral detection circuit 202 to the estimated void radius, b, derived from the data signal received from EA transducer 106, and if the two estimates are within a certain percentage tolerance of one another, controller 108 may conclude (or verify), as here, that frequency spike 502 in fact represents a partial discharge within electrical device 102. The partial discharge may, in turn, result from an electrical discharge through ionized gas within a void of about 13-16 μm in radius.

Figure 6:
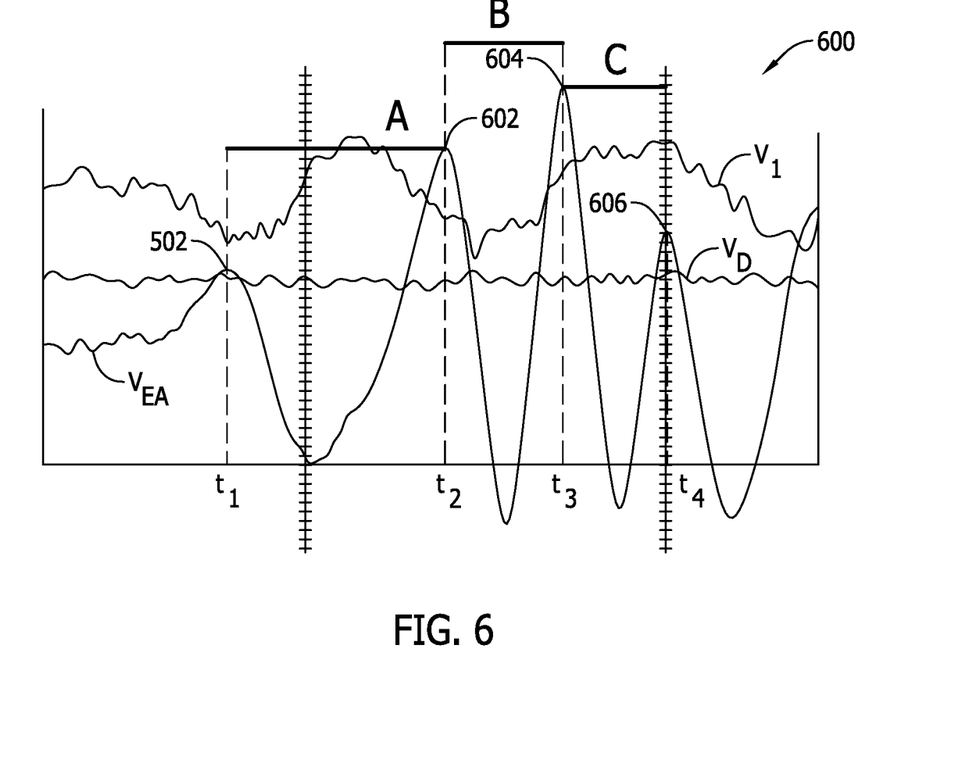
FIG. 6 is a is a zoomed-in graph of several output waveforms of the system shown in FIG. 2, in which dielectric breakdown and/or partial discharge of the electrical device occurs, and illustrating an accelerating pressure wave resulting from dielectric breakdown and/or partial discharge of the electrical device.

FIG. 6 is a zoomed-in graph 600 of the output waveforms shown in FIG. 5. Generally, FIG. 6 illustrates, in closer detail, frequency spike 502 and an accelerating pressure wave resulting from the partial discharge. Accordingly, FIG. 6 shows the voltage across electrical circuit 102 ($V_1$), the differential voltage ($V_d$) between third leg 208 and fourth leg 210 (i.e., electrical circuit 102), the current ($i_{1-3}$) passing through electrical circuit 102, and the data signal ($V_{EA}$) received from EA transducer 106.

At this scale, controller 108 may perform a third verification that PD has occurred within dielectric 104 of electrical device 102. Specifically, as shown, if frequency spike 502 occurs at time, $t_1$, the acoustic vibration within dielectric 104 (or within the air contained in the void, if an air microphone is used) oscillates to a second peak 602 at time, $t_2$, to a third peak 604 at time, $t_3$, and a fourth peak 606 at time, $t_4$.

As a result of the fact that PD releases heat energy within dielectric 104, a first time gap, A, between frequency spike 502 and a first subsequent peak 602 may be measured. Likewise a second time gap, B, between peak 602 and a second subsequent peak 604 may be measured, and a third time gap C between peak 604 and a third subsequent peak 606 may be measured. Generally, the time gap between an earlier occurring peak and a later occurring peak may be expected to decrease as the speed of sound within dielectric 104 increases in proportion to the resultant temperature increase (i.e., warmer transmission media may in at least some cases be expected to conduct acoustic vibrations at higher speeds).

Thus, to verify that frequency spike 502 was in fact the result of partial discharge, controller 108 may also compare a time gap between frequency spike 502 and a subsequent peak 602, such as time gap A, to a time gap between peak 602 and peak 604 (i.e., time gap B) and/or peak 604 and peak 606 (i.e., time gap C). If time gap B and/or time gap C is less than time gap A, controller 108 may determine (or verify) that frequency spike 502 arose as a result of PD. A similar comparison of time gap C to time gap B may also be performed.

As described more briefly above, some embodiments may include a plurality of EA transducers 106. A plurality of EA transducers 106 may be included for a variety of reasons. For example, in one embodiment, each EA transducer 106 of the plurality of EA transducers 106 may be positioned on a structure to detect or "listen for" PD in a region or zone proximate the EA transducer 106. In a related embodiment, a plurality of EA transducers 106 may be positioned on a dielectric structure for the purpose of pinpointing a location of PD on the dielectric structure. For example, it will be appreciated that if three EA transducers 106 are positioned on a dielectric structure, a pinpoint location of PD on the dielectric structure may be geometrically determined (e.g., by triangulating or trilaterating) based upon a time of acoustic onset at each EA transducer 106 (i.e., a time that each EA transducer 106 detects the acoustic vibration).

Technical effects of the systems and methods for acoustically detecting dielectric breakdown and/or partial discharge of an electrical device include: (a) acoustic detection, using an electroacoustic transducer coupled to a dielectric of an electrical device, of an acoustic vibration representative of partial discharge and/or dielectric breakdown; (b) detection, using a quadrilateral detection circuit, of one or more circuit characteristics representative of partial discharge and/or dielectric breakdown; (c) verification, using the circuit characteristics derived from the quadrilateral detection circuit, of partial discharge and/or dielectric breakdown; (d) verification of partial discharge and/or dielectric breakdown based upon comparison of peak-to-peak distances or gaps between frequency spikes of peaks of a signal received from the electroacoustic transducer; and (e) generation of an alert, warning, or other indication that partial discharge and/or dielectric breakdown have occurred.

The systems and methods described herein are not limited to the specific embodiments described herein, but rather, components of the systems and/or steps of the methods may be utilized independently and separately from other components and/or steps described herein.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

As used herein, an element or step recited in the singular and proceeded with the word "a" or "an" should be understood as not excluding plural elements or steps unless such exclusion is explicitly recited. Furthermore, references to "one embodiment" of the present disclosure or "an example embodiment" are not intended to be interpreted as excluding the existence of additional embodiments that also incorporate the recited features.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for acoustically detecting dielectric breakdown or partial discharge of an electrical device, the system comprising:
   at least one electroacoustic (EA) transducer configured to detect an acoustic vibration of the electrical device;
   a controller electrically connected to the at least one EA transducer; and
   a quadrilateral detection circuit having four legs, wherein three of the four legs have a known resistance, and one of the four legs includes the electrical device, and wherein the quadrilateral detection circuit is electrically connected to the controller;
   wherein the controller is configured to execute instructions stored in a memory, which when executed, cause the controller to at least:
   receive a signal from the at least one EA transducer;
   analyze the signal received from the at least one EA transducer;
   determine, based upon the analyzing, whether the signal received from the at least one EA transducer includes data associated with an acoustic vibration in a frequency range of partial discharge of the electrical device;
   receive at least one measurement from the quadrilateral detection circuit;
   in response to determining that the signal received from the at least one EA transducer includes the data associated with the acoustic vibration in the frequency range of partial discharge, verify the determination based upon the at least one measurement received from the quadrilateral detection circuit; and
   generate an alert in response to determining that the signal received from the at least one EA transducer includes the data associated with the acoustic vibration in the frequency range of partial discharge.

2. The system of claim 1, wherein the quadrilateral detection circuit is one of a Wheatstone Bridge or a Schering Bridge.

3. The system of claim 1, wherein to verify the determination that the signal received from the at least one EA transducer includes the data associated with the acoustic vibration in the frequency range of partial discharge, the instructions, when executed, further cause the controller to at least:
   calculate, from a time period of the acoustic vibration in the frequency range of partial discharge and a speed of sound stored in the memory, a first estimate of at least one physical dimension of a void in a dielectric of the electrical device, the void producing partial discharge;
   calculate, from the at least one measurement received from the quadrilateral detection circuit, an electric field within the void and, from the calculated electric field, a second estimate of the at least one physical dimension of the void in the dielectric of the electrical device; and
   compare the first estimate of the at least one physical dimension to the second estimate of the at least one physical dimension.

4. The system of claim 1, wherein the at least one EA transducer is a contact microphone configured to be mechanically coupled to a dielectric of the electrical device to detect the acoustic vibration.

5. The system of claim 1, wherein the at least one EA transducer is a piezoelectric microphone configured to be mechanically coupled to a dielectric of the electrical device to detect the acoustic vibration.

6. The system of claim 1, wherein the acoustic vibration is structural within a dielectric of the electrical device, and wherein the at least one EA transducer is configured to be mechanically coupled to the dielectric of the electrical device to detect the acoustic vibration.

7. An electrical system comprising:
an electrical device;
at least one electroacoustic (EA) transducer mechanically coupled to the electrical device and configured to detect an acoustic vibration of the electrical device;
a controller electrically connected to the at least one EA transducer and
a quadrilateral detection circuit having four legs, wherein three of the four legs have a known resistance, and one of the four legs includes the electrical device, and wherein the quadrilateral detection circuit is electrically connected to the controller,
wherein the controller is configured to execute instructions stored in a memory, which when executed, cause the controller to at least:
receive a signal from the at least one EA transducer;
analyze the signal received from the at least one EA transducer;
determine, based upon the analyzing, whether the signal received from the at least one EA transducer includes data associated with an acoustic vibration of the electrical device in a frequency range of partial discharge of the electrical device;
receive at least one measurement from the quadrilateral detection circuit;
in response to determining that the signal received from the at least one EA transducer includes the data associated with the acoustic vibration in the frequency range of partial discharge, verify the determination based upon the at least one measurement received from the quadrilateral detection circuit; and
generate an alert in response to determining that the signal received from the at least one EA transducer includes the data associated with the acoustic vibration in the frequency range of partial discharge.

8. The electrical system of claim 7, wherein the quadrilateral detection circuit is one of a Wheatstone Bridge or a Schering Bridge.

9. The electrical system of claim 7, wherein to verify the determination that the signal received from the at least one EA transducer includes the data associated with the acoustic vibration in the frequency range of partial discharge, the instructions, when executed, further cause the controller to at least:
calculate, from a time period of the acoustic vibration in the frequency range of partial discharge and a speed of sound stored in the memory, a first estimate of at least one physical dimension of a void in a dielectric of the electrical device, the void producing partial discharge;
calculate, from the at least one measurement received from the quadrilateral detection circuit, an electric field within the void and, from the calculated electric field, a second estimate of the at least one physical dimension of the void in the dielectric of the electrical device; and
compare the first estimate of the at least one physical dimension to the second estimate of the at least one physical dimension.

10. The electrical system of claim 7, wherein the electrical device is configured to control an aerospace system, and wherein the aerospace system generates ambient noise in a frequency range lower than the frequency range of partial discharge.

11. The electrical system of claim 7, wherein the acoustic vibration is structural within a dielectric of the electrical device, and wherein the at least one EA transducer is configured to be mechanically coupled to the dielectric of the electrical device to detect the acoustic vibration.

12. The electrical system of claim 7, wherein the at least one EA transducer is a contact microphone configured to be mechanically coupled to a dielectric of the electrical device to detect the acoustic vibration.

13. The electrical system of claim 7, wherein the at least one EA transducer is a piezoelectric microphone configured to be mechanically coupled to a dielectric of the electrical device to detect the acoustic vibration.

14. A method for acoustically detecting partial discharge of an electrical device, the method comprising:
receiving, by a controller electrically connected to at least one electroacoustic (EA) transducer, a signal from the at least one EA transducer, the at least one EA transducer mechanically coupled to the electrical device and configured to detect an acoustic vibration of the electrical device;
analyzing, by the controller, the signal received from the at least one EA transducer;
determining, by the controller and based upon the analyzing, whether the signal received from the at least one EA transducer includes data associated with an acoustic vibration in a frequency range of partial discharge of the electrical device;
receiving, by the controller, at least one measurement from a quadrilateral detection circuit having four legs, wherein three of the four legs have a known resistance and one of the four legs includes the electrical device, and wherein the quadrilateral detection circuit is electrically connected to the controller;
in response to determining that the signal received from the at least one EA transducer includes the data associated with the acoustic vibration in the frequency range of partial discharge, verifying, by the controller, the determination based upon the at least one measurement received from the quadrilateral detection device; and
generating an alert in response to determining that the signal received from the at least one EA transducer includes the data associated with the acoustic vibration in the frequency range of partial discharge.

15. The method of claim 14, wherein to verify the determination that the signal received from the at least one EA transducer includes the data associated with the acoustic vibration in the frequency range of partial discharge, the method further comprises:
calculating, by the controller and from a time period of the acoustic vibration in the frequency range of partial discharge and a speed of sound stored in a memory, a first estimate of at least one physical dimension of a void in a dielectric of the electrical device, the void producing the partial discharge;
calculating, by the controller and from the at least one measurement received from the quadrilateral detection circuit, an electric field within the void and, from the calculated electric field, a second estimate of the at least one physical dimension of the void in the dielectric of the electrical device; and comparing, by the controller, the first estimate of the at least one physical dimension to the second estimate of the at least one physical dimension.

16. The method of claim 14, wherein the at least one EA transducer is a contact microphone configured to be mechanically coupled to a dielectric of the electrical device to detect the acoustic vibration.

17. The method of claim 14, wherein the at least one EA transducer is a piezoelectric microphone configured to be mechanically coupled to a dielectric of the electrical device to detect the acoustic vibration.

18. The method of claim 14, wherein the acoustic vibration is structural within a dielectric of the electrical device, and wherein the at least one EA transducer is configured to be mechanically coupled to the dielectric of the electric device to detect the acoustic vibration.

* * * * *